US008963696B2

(12) United States Patent
Wang

(10) Patent No.: US 8,963,696 B2
(45) Date of Patent: Feb. 24, 2015

(54) APPARATUS FOR PERFORMING KEY CONTROL WITH REDUCED KEY MATRIX PIN COUNT

(75) Inventor: Tzu-Hung Wang, Hsinchu County (TW)

(73) Assignee: MEDIATEK Inc., Science-Based Industrial Park, Hsin-Chu (TW)

( * ) Notice: Subject to any disclaimer, the term of this patent is extended or adjusted under 35 U.S.C. 154(b) by 587 days.

(21) Appl. No.: 13/334,077

(22) Filed: Dec. 22, 2011

(65) Prior Publication Data
US 2013/0162452 A1      Jun. 27, 2013

(51) Int. Cl.
*H04B 3/36* (2006.01)
(52) U.S. Cl.
USPC .............. 340/407.1; 341/22; 341/23; 341/24; 341/26; 341/27; 341/33; 341/34; 345/169; 345/173
(58) Field of Classification Search
CPC ............................. H03K 17/94; G06F 3/0202
USPC ................. 341/22, 23–24, 26–27, 30, 33–34; 340/407.1; 345/169, 173
See application file for complete search history.

(56) References Cited

U.S. PATENT DOCUMENTS

| 8,482,437 B1 * | 7/2013 | Hua et al. .......................... 341/33 |
| 8,492,665 B1 * | 7/2013 | Yang ........................... 178/18.06 |
| 8,711,011 B2 * | 4/2014 | Casparian et al. ............... 341/34 |

* cited by examiner

*Primary Examiner* — Tai T Nguyen
(74) *Attorney, Agent, or Firm* — Winston Hsu; Scott Margo

(57) ABSTRACT

An apparatus for performing key control includes an integrated circuit (IC) arranged to detect a key press according to some input/output signals of a key matrix, where the input/output signals include first input/output signals corresponding to a first direction and second input/output signals corresponding to a second direction. In addition, the IC includes a plurality of first pins and a plurality of second pins, for transmitting the first and the second input/output signals, respectively. In particular, during the detection of the key press, the IC controls at least one first pin of the first pins to be in an output mode and controls the second pins to be in an input mode in a first time period, and controls at least one second pin of the second pins to be in an output mode and controls the first pins to be in an input mode in a second time period.

21 Claims, 9 Drawing Sheets

APPARATUS FOR PERFORMING KEY CONTROL WITH REDUCED KEY MATRIX PIN COUNT

BACKGROUND

The present invention relates to key matrix pin count reduction of an electronic device, and more particularly, to apparatus for performing key control.

According to the related art, a portable electronic device equipped with a plurality of keys can be utilized for editing a document or a message by an end user. In a situation where reducing costs is required for designing a product of a lower price in a target market, some problems may occur. More particularly, when the overall pin count should be reduced to save costs, it seems unlikely that reducing the key matrix pin count (e.g. the number of pins for a key matrix) will be helpful since, according to the related art, reducing the key matrix pin count typically causes a reduced number of keys available for the end user. For example, a conventional key matrix having forty-nine keys typically needs fourteen pins (e.g. (7+7) pins for (7*7) keys), which are all non-removable according to the related art. In conclusion, there is a need to reduce the key matrix pin count.

SUMMARY

It is therefore an objective of the claimed invention to provide apparatus for performing key control, in order to solve the above-mentioned problems.

It is another objective of the claimed invention to provide apparatus for performing key control, in order to implement an electronic device with a reduced key matrix pin count, which is less than the key matrix pin count of a conventional electronic device implemented according to the related art.

An exemplary embodiment of an apparatus for performing key control is provided, where the apparatus comprises at least one portion of an electronic device. The apparatus comprises an integrated circuit (IC) arranged to detect a key press according to at least one portion of a plurality of input/output signals of a key matrix comprising a plurality of keys, wherein the input/output signals of the key matrix comprise a plurality of first input/output signals corresponding to a first direction, and further comprise a plurality of second input/output signals corresponding to a second direction. In addition, the IC comprises a plurality of first pins and a plurality of second pins. The plurality of first pins is arranged to transmit the plurality of first input/output signals corresponding to the first direction, and the plurality of second pins is arranged to transmit the plurality of second input/output signals corresponding to the second direction. Additionally, during the detection of the key press, the IC controls at least one first pin of the plurality of first pins to be in an output mode and controls the plurality of second pins to be in an input mode in a first time period, and controls at least one second pin of the plurality of second pins to be in an output mode and controls the plurality of first pins to be in an input mode in a second time period.

An exemplary embodiment of an apparatus for performing key control is provided, where the apparatus comprises at least one portion of an electronic device. The apparatus comprises an IC arranged to detect a key press according to at least one portion of a plurality of input/output signals of a key matrix comprising a plurality of keys, wherein the input/output signals of the key matrix comprise a plurality of first input/output signals corresponding to a first direction, and further comprise a plurality of second input/output signals corresponding to a second direction. In addition, the IC comprises a decision circuit arranged to decide whether the key press is a key press of a first key or a second key within the plurality of keys according to a first input/output signal of the first input/output signals and according to a second input/output signal of the second input/output signals. Additionally, during the detection of the key press, the IC temporarily asserts the first input/output signal and detects whether the second input/output signal is greater than a first predetermined voltage level in a first time period, in order to determine whether one of the first key and the second key is pressed; and when it is detected that one of the first key and the second key is pressed, the IC temporarily asserts the second input/output signal and detects whether the first input/output signal is less than a second predetermined voltage level in a second time period, in order to determine whether the second key/the first key is pressed.

An exemplary embodiment of an apparatus for performing key control is provided, where the apparatus comprises at least one portion of an electronic device. The apparatus comprises an IC arranged to detect a key press according to at least one portion of a plurality of input/output signals of a key matrix comprising a plurality of keys, wherein the input/output signals of the key matrix comprise a plurality of first input/output signals corresponding to a first direction, and further comprise a plurality of second input/output signals corresponding to a second direction. In addition, the IC comprises a plurality of first pins and a plurality of second pins. The plurality of first pins is arranged to transmit the plurality of first input/output signals corresponding to the first direction, wherein a first pin of the first pins is electrically connected to a first terminal of a first key of the key matrix and is electrically connected to a first terminal of a second key of the key matrix. The plurality of second pins arranged to transmit the plurality of second input/output signals corresponding to the second direction, wherein a second pin of the second pins is electrically connected to a second terminal of the first key. Additionally, the apparatus further comprises a resistor having a first terminal and a second terminal, wherein the first terminal of the resistor is electrically connected to the second pin, and the second terminal of the resistor is electrically connected to a second terminal of the second key.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in sub-module. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
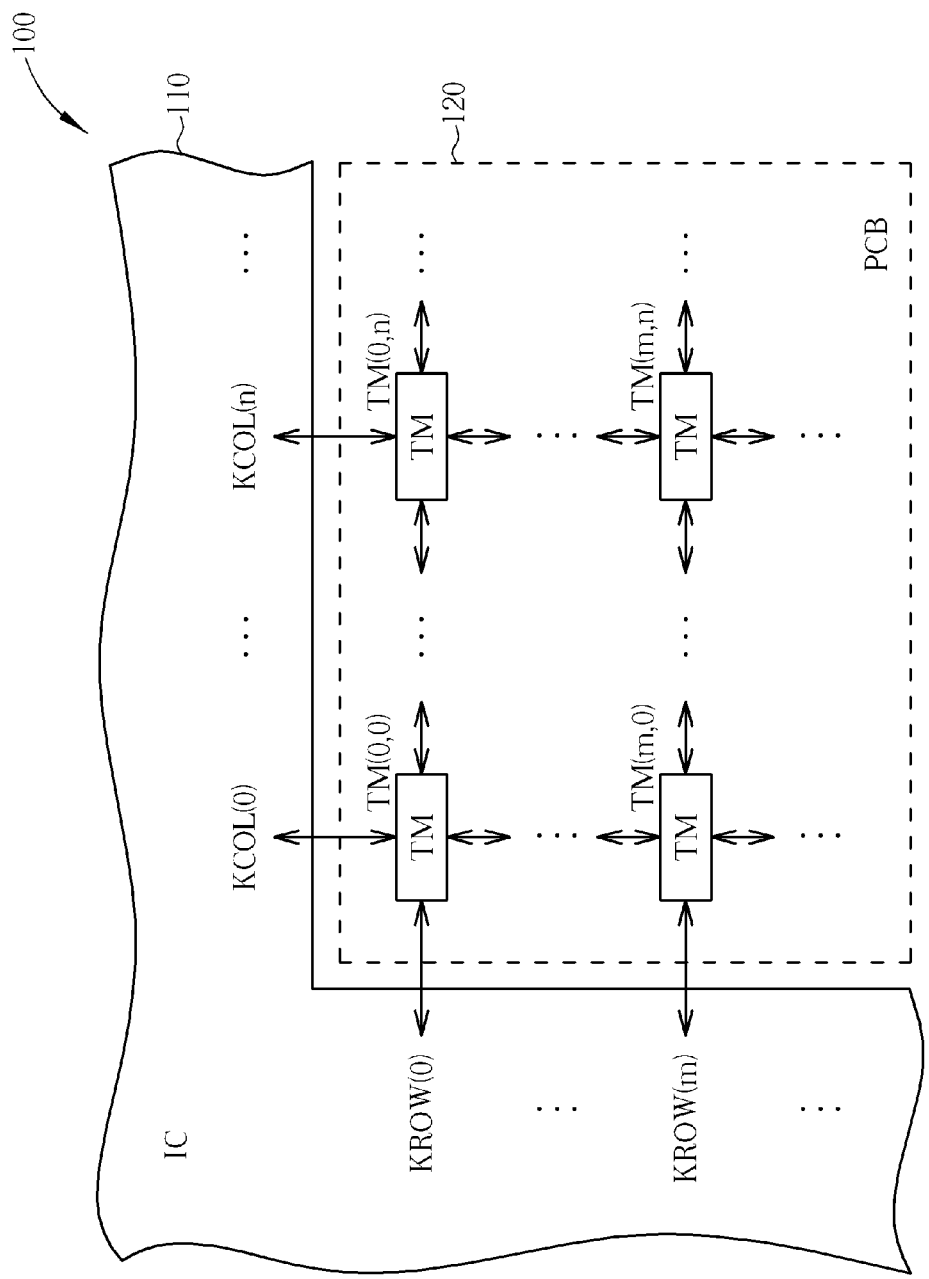
FIG. 1 is a diagram of an apparatus for performing key control according to a first embodiment of the present invention.

Please refer to FIG. 1, which illustrates a diagram of an apparatus 100 for performing key control according to a first embodiment of the present invention. According to different embodiments, such as the first embodiment and some variations thereof, the apparatus 100 may comprise at least one portion (e.g. a portion or all) of an electronic device. For example, the apparatus 100 may comprise a portion of the electronic device mentioned above, and more particularly, can be a control circuit such as an integrated circuit (IC) within the electronic device. In another example, the apparatus 100 can be the whole of the electronic device mentioned above. In another example, the apparatus 100 can be an audio/video system comprising the electronic device mentioned above. Examples of the electronic device may include, but not limited to, a mobile phone (e.g. a multifunctional mobile phone), a personal digital assistant (PDA), and a personal computer such as a laptop computer or desktop computer.

According to the first embodiment, the apparatus 100 comprises an IC 110 and a printed circuit board (PCB) 120, where the apparatus 100 may comprise at least one two-key control module implemented within/on the PCB 120, such as a plurality of two-key control modules, each of which (e.g. a two-key control module under consideration) can be utilized for performing key control of two keys. In addition, the IC 110 is arranged to detect a key press according to at least one portion of a plurality of input/output signals of a key matrix comprising a plurality of keys (e.g. the two keys controlled by the two-key control module under consideration). In this embodiment, the input/output signals of the key matrix typically comprise a plurality of first input/output signals corresponding to a first direction, such as the row signals $\{KROW(m)|m=0, 1, \ldots, or (M-1)\}$, and further comprise a plurality of second input/output signals corresponding to a second direction, such as the column signals $\{KCOL(n)|n=0, 1, \ldots, or (N-1)\}$.

As shown in FIG. 1, the apparatus 100 may comprise (M*N) two-key control modules $\{TM(m, n)|m=0, 1, \ldots, or (M-1); n=0, 1, \ldots, or (N-1)\}$ (e.g. the two-key control modules $\{\{TM(0, 0), \ldots, TM(0, n), \ldots, TM(0, (N-1))\}, \ldots, \{TM(m, 0), \ldots, TM(m, n), \ldots, TM(m, (N-1))\}, \ldots, \{TM((M-1), 0), \ldots, TM((M-1), n), \ldots, TM((M-1), (N-1))\}\}$, some of which are respectively labeled "TM" in FIG. 1), where any of the predetermined values M and N can be a positive integer, and more particularly, can be an integer that is greater than one. This is for illustrative purposes only, and is not meant to be a limitation of the present invention. According to some variations of this embodiment, one of the predetermined values M and N can be an integer that is greater than one, and the other of the predetermined values M and N can be equal to one. According to another variation of this embodiment, both of the predetermined values M and N can be equal to one, which means the number of two-key control modules within the set of two-key control modules (or the two-key control module set) $\{TM(m, n)|m=0, 1, \ldots, or (M-1); n=0, 1, \ldots, or (N-1)\}$ can be equal to one in this variation.

According to this embodiment, the IC 110 comprises a plurality of pins, some of which are utilized for respectively transmitting the input/output signals mentioned above. More particularly, within the pins that are utilized for respectively transmitting the input/output signals of the key matrix, those that are utilized for respectively transmitting the first signals (e.g. the row signals $\{KROW(m)|m=0, 1, \ldots, or (M-1)\}$) corresponding to the first direction (e.g. the direction corresponding to rows of the key matrix) can be referred to as first pins (e.g. the row pins), and those that are utilized for respectively transmitting the second signals (e.g. the column signals $\{KCOL(n)|n=0, 1, \ldots, or (N-1)\}$) corresponding to the second direction (e.g. the direction corresponding to columns of the key matrix) can be referred to as second pins (e.g. the column pins). Please note that the pin count of the row pins for transmitting the row signals $\{KROW(m)|m=0, 1, \ldots, or (M-1)\}$ between the IC 110 and the PCB 120 is equal to M, while the pin count of the column pins for transmitting the column signals $\{KCOL(n)|n=0, 1, \ldots, or (N-1)\}$ between the IC 110 and the PCB 120 is equal to N. Thus, the total pin count of the row pins respectively corresponding to the row signals $\{KROW(m)|m=0, 1, \ldots, or (M-1)\}$ and the column pins respectively corresponding to the column signals $\{KCOL(n)|n=0, 1, \ldots, or (N-1)\}$ is equal to (M+N).

According to this embodiment, each of the aforementioned two-key control modules $\{TM(m, n)|m=0, 1, \ldots, or (M-1); n=0, 1, \ldots, or (N-1)\}$ may input/output an associated row signal of the row signals $\{KROW(m)|m=0, 1, \ldots, or (M-1)\}$ and may input/output an associated column signal of the column signals $\{KCOL(n)|n=0, 1, \ldots, or (N-1)\}$. As each of the two-key control modules $\{TM(m, n)|m=0, 1, \ldots, or (M-1); n=0, 1, \ldots, or (N-1)\}$ can provide key control of two keys of the electronic device, the apparatus 100 can provide key control of $(2*(M*N))$ keys of the electronic device, by utilizing the (M+N) pins.

As mentioned, each of the two-key control modules $\{TM(m, n)|m=0, 1, \ldots, or (M-1); n=0, 1, \ldots, or (N-1)\}$ can provide key control of two keys of the electronic device. This does not imply that the two keys of the two-key control module under consideration (e.g. the two-key control module TM(m, n)) should be positioned outside the two-key control module under consideration. According to different embodiments, such as the first embodiment and some variations thereof, the two keys controlled by the two-key control module TM(m, n) can be implemented within the two-key control module TM(m, n), or can be implemented outside the two-key control module TM(m, n), or can be partially implemented within the two-key control module TM(m, n).

Figure 2:
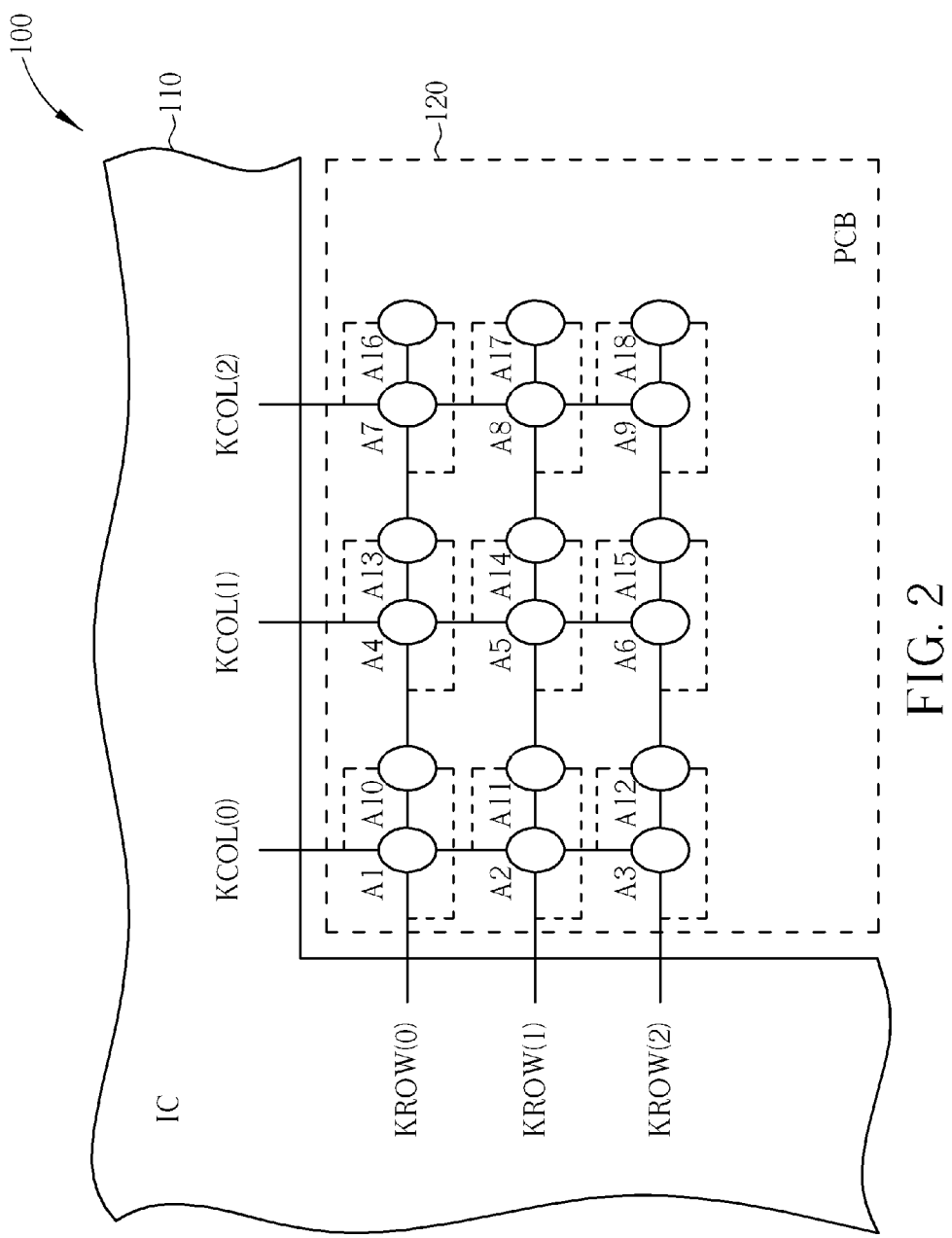
FIG. 2 illustrates some possible paths of some exemplary two-key control modules within/on the printed circuit board (PCB) shown in FIG. 1 according to an embodiment of the present invention.

FIG. 2 illustrates some possible paths of some exemplary two-key control modules within/on the PCB 120 shown in FIG. 1 according to an embodiment of the present invention. For brevity, both of the predetermined values M and N in this embodiment can be equal to three. In this embodiment, the two-key control modules {{TM(0, 0), TM(0, 1), TM(0, 2)}, {TM(1, 0), TM(1, 1), TM(1, 2)}, {TM(2, 0), TM(2, 1), TM(2, 2)}} are arranged to control the sets of keys {{{A1, A10}, {A4, A13}, {A7, A16}}, {{A2, A11}, {A5, A14}, {A8, A17}}, {{A3, A12}, {A6, A15}, {A9, A18}}}, respectively. For example, the two-key control module TM(0, 0) corresponding to the row signal KROW(0) and the column signal KCOL(0) is arranged to control the set of keys {A1, A10}. In another example, the two-key control module TM(2, 2) corresponding to the row signal KROW(2) and the column signal KCOL(2) is arranged to control the set of keys {A9, A18}.

According to this embodiment, each of the aforementioned two-key control modules {TM(m, n)|m=0, 1, ..., or (M−1); n=0, 1, ..., or (N−1)} may have some possible paths (which are illustrated with dashed lines around each set of keys, for example) within/on the PCB 120. More particularly, one or more of the possible paths of a two-key control module under consideration (e.g. the two-key control module TM(0, 0)) may be activated or utilized when one of the set of keys controlled by the two-key control module under consideration (e.g. one of the set of keys {A1, A10}, such as the key A10) is pressed by the user.

In some embodiments, such as those respectively shown in FIGS. 3-9, during the detection of the key press, the IC 110 typically controls at least one first pin of the plurality of first pins to be in an output mode and controls the plurality of second pins to be in an input mode in a first time period, and controls at least one second pin of the plurality of second pins to be in an output mode and controls the plurality of first pins to be in an input mode in a second time period. For example, in the first time period, the IC 110 temporarily asserts a first input/output signal that is transmitted by utilizing the aforementioned at least one first pin, and more particularly, temporarily asserts the first input/output signal by pulling the first input/output signal to a high voltage level $V_{H1}$ of the first input/output signal. Thus, the aforementioned at least one first pin is in the output mode thereof in the first time period. In another example, in the second time period, the IC 110 temporarily asserts a second input/output signal that is transmitted by utilizing the aforementioned at least one second pin, and more particularly, temporarily asserts the second input/output signal by pulling the second input/output signal to a high voltage level $V_{H2}$ of the second input/output signal. Thus, the aforementioned at least one second pin is in the output mode thereof in the second time period. In practice, the high voltage level $V_{H1}$ of the first input/output signal can be equivalent to the high voltage level $V_{H2}$ of the second input/output signal, and in a situation where the high voltage level $V_{H1}$ is equivalent to the high voltage level $V_{H2}$, both of the high voltage level $V_{H1}$ and the high voltage level $V_{H2}$ can be referred to as the high voltage level $V_H$. Typically, one of the first pins is in the output mode at a time during the detection of the key press, and one of the second pins is in the output mode at a time during the detection of the key press.

According to these embodiments, in the first time period, the IC 110 temporarily de-asserts the second input/output signals that are transmitted by utilizing the second pins, and more particularly, temporarily de-asserts the second input/output signals by keeping the second input/output signals at a low voltage level $V_{L2}$ thereof. Thus, the second pins are in the input mode thereof in the first time period. In addition, in the second time period, the IC 110 temporarily de-asserts the first input/output signals that are transmitted by utilizing the first pins, and more particularly, temporarily de-asserts the first input/output signals by keeping the first input/output signals at a low voltage level $V_{L1}$ thereof. Thus, the first pins are in the input mode thereof in the second time period. In practice, the low voltage level $V_{L2}$ of the second input/output signals can be equivalent to the low voltage level $V_{L1}$ of the first input/output signals, and in a situation where the low voltage level $V_{L2}$ is equivalent to the low voltage level $V_{L1}$, both of the low voltage level $V_{L2}$ and the low voltage level $V_{L1}$ can be referred to as the low voltage level $V_L$.

Figure 3:
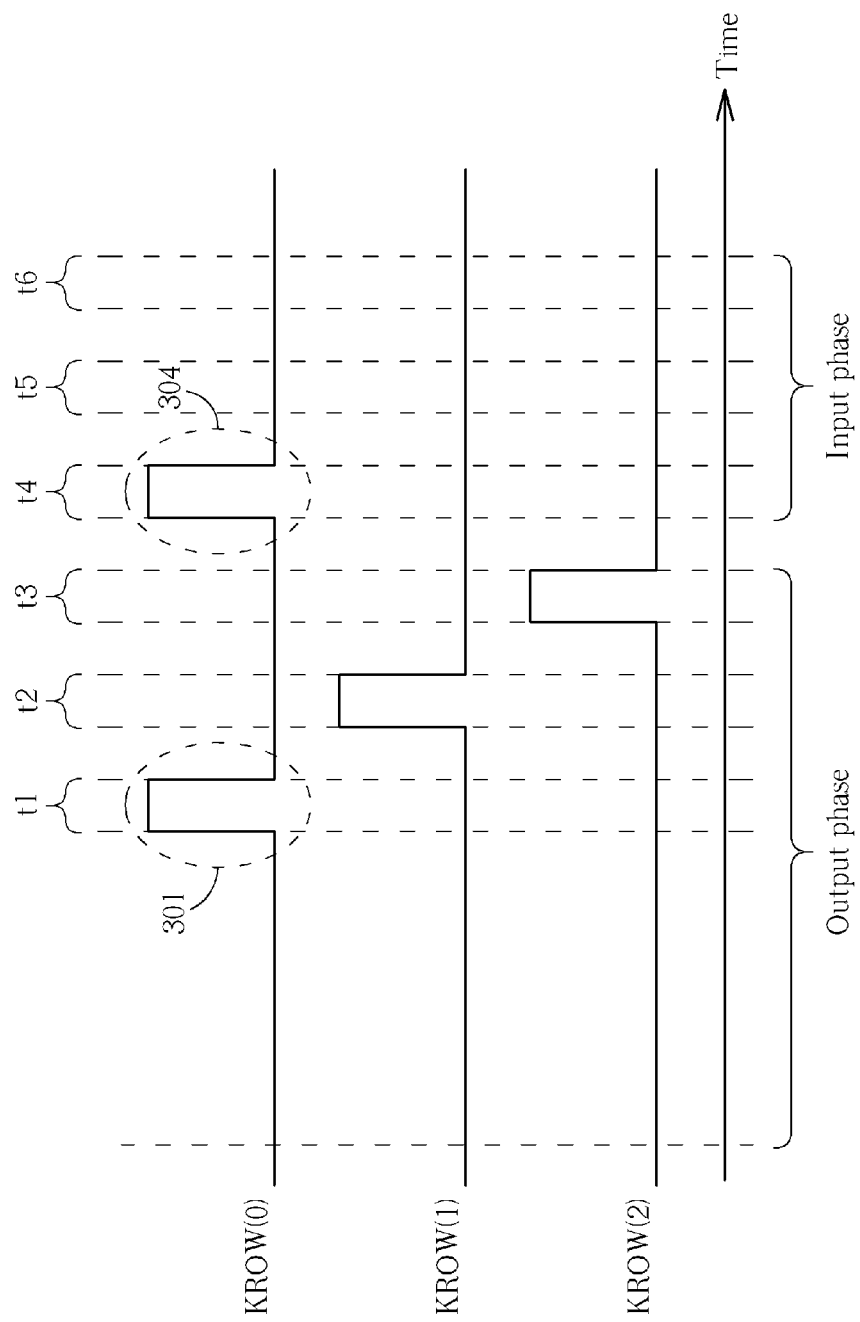
FIG. 3 illustrates a timing chart of some row signals shown in FIG. 2 according to an embodiment of the present invention.
Figure 4:
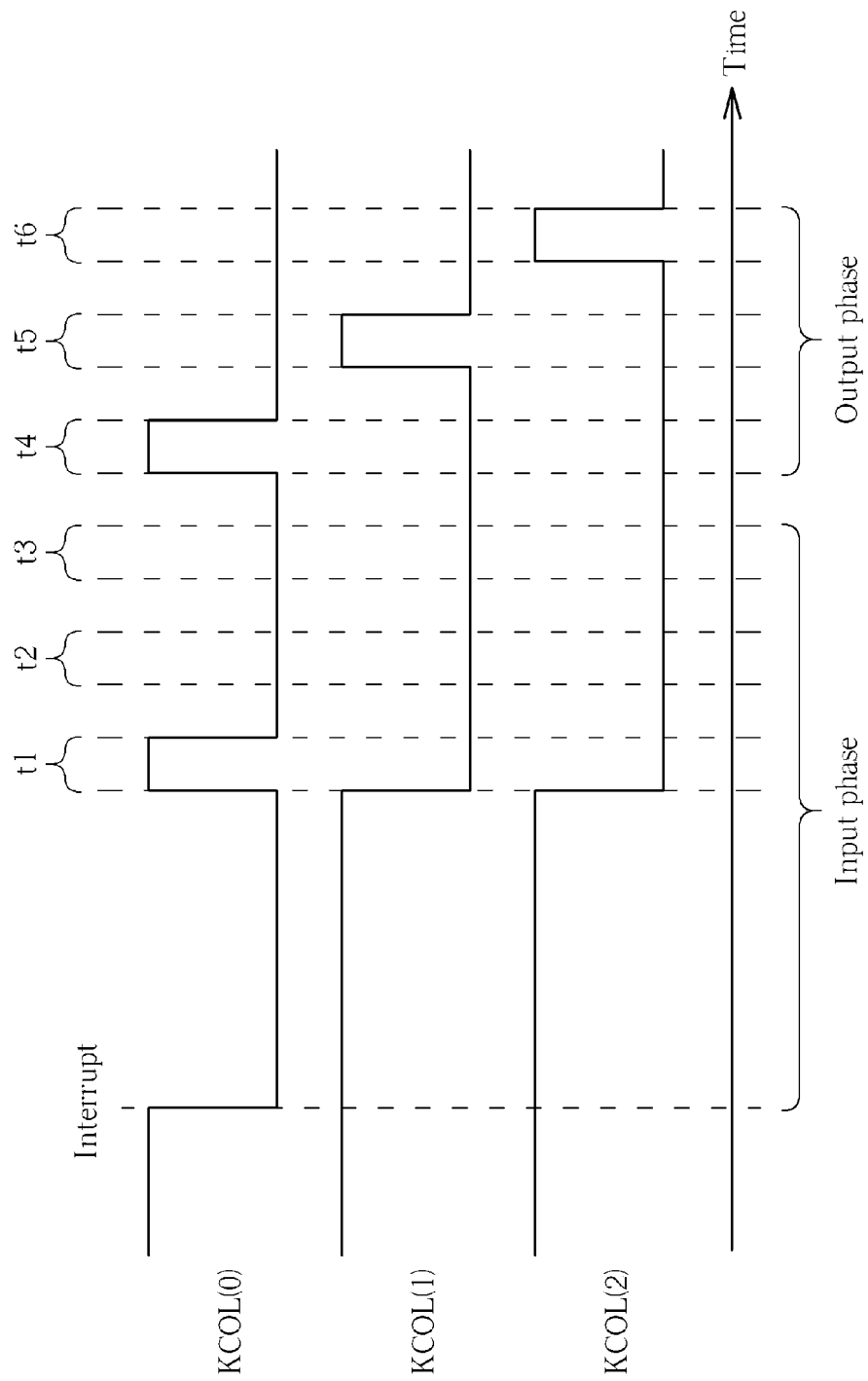
FIG. 4 illustrates a timing chart of some column signals shown in FIG. 2 according to the embodiment shown in FIG. 3.

Please refer to both of FIG. 3 and FIG. 4. FIG. 3 illustrates a timing chart of some row signals KROW(0), KROW(1), and KROW(2) shown in FIG. 2 according to an embodiment of the present invention, and FIG. 4 illustrates a timing chart of some column signals KCOL(0), KCOL(1), and KCOL(2) shown in FIG. 2 according to this embodiment.

As shown in FIG. 3 and FIG. 4, an input phase of the set of column signals KCOL(0), KCOL(1), and KCOL(2) corresponds to an output phase of the set of row signals KROW(0), KROW(1), and KROW(2), while an input phase of the set of row signals KROW(0), KROW(1), and KROW(2) corresponds to an output phase of the set of column signals KCOL(0), KCOL(1), and KCOL(2). Please note that an interrupt is taken as an example of means for triggering associated operations disclosed in FIG. 3 and FIG. 4, where the interrupt of this embodiment represents a voltage drop due to a key press of the user, and more particularly, the voltage drop of the column signal KCOL(0) before the input phase of the set of column signals KCOL(0), KCOL(1), and KCOL(2) in this embodiment.

In the output phase of the set of row signals KROW(0), KROW(1), and KROW(2), the IC 110 is arranged to assert the row signals KROW(0), KROW(1), and KROW(2) in a plurality of time periods t1, t2, and t3, respectively. More particularly, in the output phase of the set of row signals KROW(0), KROW(1), and KROW(2), the IC 110 controls the row signals KROW(0), KROW(1), and KROW(2) to be pulled to the high voltage level $V_H$ in the time periods t1, t2, and t3, respectively. In addition, the IC 110 is arranged to detect (or read) the column signals KCOL(0), KCOL(1), and KCOL(2) in the input phase of the set of column signals KCOL(0), KCOL(1), and KCOL(2). For example, it is detected (or read) in the IC 110 that the column signal KCOL(0) is asserted by the row signal KROW(0) due to the key press of the user (e.g. the column signal KCOL(0) is pulled to the high voltage level $V_H$), and therefore, the IC 110 determines that a specific key of the set of keys {A1, A10} is pressed.

Afterward, in the output phase of the set of column signals KCOL(0), KCOL(1), and KCOL(2), the IC 110 is arranged to assert the column signals KCOL(0), KCOL(1), and KCOL(2) in a plurality of time periods t4, t5, and t6, respectively. More particularly, in the output phase of the set of column signals KCOL(0), KCOL(1), and KCOL(2), the IC 110 controls the column signals KCOL(0), KCOL(1), and KCOL(2) to be pulled to the high voltage level $V_H$ in the time periods t4, t5, and t6, respectively. In addition, the IC 110 is arranged to detect (or read) the row signals KROW(0), KROW(1), and KROW(2) in the input phase of the set of row signals KROW(0), KROW(1), and KROW(2). For example, it is detected (or read) in the IC 110 that the row signal KROW(0) is asserted by the column signal KCOL(0) due to the key press of the user (e.g. the row signal KROW(0) is pulled to the high voltage level $V_H$), and therefore, the IC 110 determines that the specific key is the key A1, which means the key A1 is pressed.

Please note that, within all of the pulses on the row signals KROW(0), KROW(1), and KROW(2) in the output phase shown in FIG. 3, only the pulse 301 in the time period t1 shown in FIG. 3 is eventually transmitted to be the pulse of the column signal KCOL(0) in the input phase shown in FIG. 4. As the IC 110 detects (or reads) the pulse of the column signal KCOL(0) in the input phase shown in FIG. 4, the IC 110 determines that the specific key of the set of keys {A1, A10} (rather than any set of the other sets of keys {{{A4, A13}, {A7, A16}}, {{A2, A11}, {A5, A14}, {A8, A17}}, {{A3, A12}, {A6, A15}, {A9, A18}}}) is pressed. In addition, in the time period t4 shown in FIG. 3, the IC 110 detects (or reads) the row signal KROW(0) to determine whether the row signal KROW(0) is asserted (more particularly, to determine whether there is a pulse of the row signal KROW(0) in the time period t4). As the IC 110 detects (or reads) the pulse 304 of the row signal KROW(0), the IC 110 determines that the specific key is the key A1, which means the key A1 is pressed.

According to some embodiments, such as some variations of the embodiment shown in FIG. 3 and FIG. 4, in a situation where a row signal under consideration is temporarily asserted (e.g. the row signal under consideration is pulled to the high voltage level $V_H$) in a time period, the associated row pin of the IC 110 that is utilized for transmitting the row signal under consideration can be considered to be in an output mode. In addition, in a situation where a row signal under consideration is de-asserted or is not temporarily asserted (e.g. the row signal under consideration is set/kept at the low voltage level $V_L$ or is not pulled to the high voltage level $V_H$) in a time period, the associated row pin of the IC 110 that is utilized for transmitting the row signal under consideration can be considered to be in an input mode. Thus, according to these embodiments, only one of the row pins for transmitting the set of row signals KROW(0), KROW(1), and KROW(2) is in the output mode at a time during the aforementioned output phase of the set of row signals KROW(0), KROW(1), and KROW(2).

Figure 5:
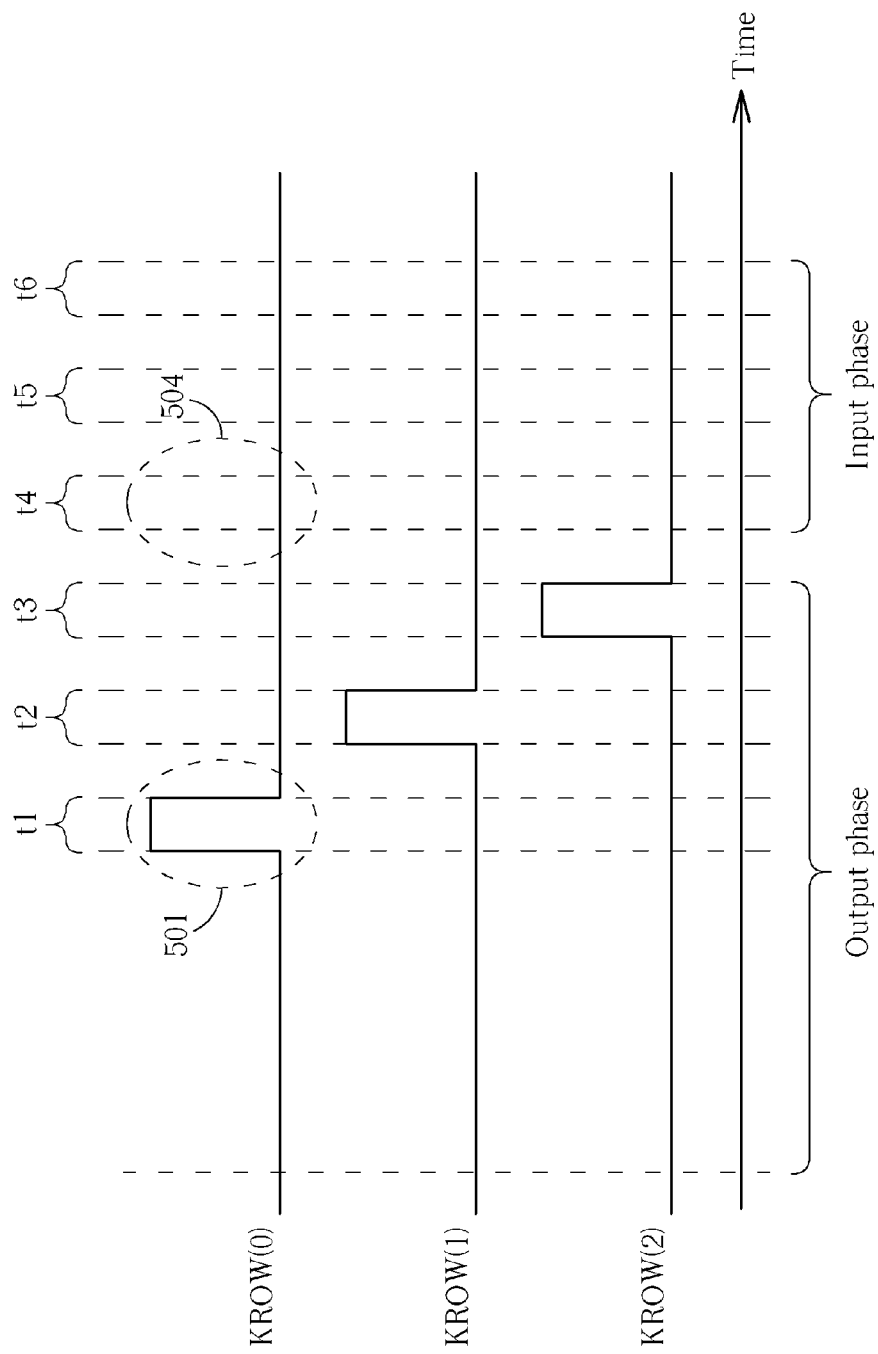
FIG. 5 illustrates a timing chart of some row signals shown in FIG. 2 according to another embodiment of the present invention.

FIG. 5 illustrates a timing chart of some row signals KROW(0), KROW(1), and KROW(2) shown in FIG. 2 according to another embodiment of the present invention, where this embodiment is a variation of the embodiment shown in FIG. 3. The pulse 501 shown in FIG. 5 can be the same as the pulse 301 mentioned above, while the pulse 304 mentioned above is replaced by a de-asserted partial curve 504, which is at the low voltage level $V_L$ in this embodiment. Please note that the voltage level of the de-asserted partial curve 504 in this embodiment is parabolically (or logically) illustrated with a low voltage level such as the low voltage level $V_L$. This is for illustrative purposes only, and is not meant to be a limitation of the present invention. In practice, some detection means of a decision circuit implemented within the IC 110 may cause the voltage level of the de-asserted partial curve 504 to be slightly higher than the low voltage level $V_L$. In addition, the curves of the set of column signals KCOL(0), KCOL(1), and KCOL(2) of this embodiment can be the same as those shown in FIG. 4, respectively, where the voltage level of the asserted partial curve (or the pulse) of the column signal KCOL(0) in the time period t1 is parabolically (or logically) illustrated with a high voltage level such as the high voltage level $V_H$. This is for illustrative purposes only, and is not meant to be a limitation of the present invention. In practice, some detection means of the aforementioned decision circuit implemented within the IC 110 may cause the voltage level of this asserted partial curve of the column signal KCOL(0) in the time period t1 to be slightly lower than the high voltage level $V_H$.

In the output phase of the set of row signals KROW(0), KROW(1), and KROW(2), the IC 110 is arranged to assert the row signals KROW(0), KROW(1), and KROW(2) in the time periods t1, t2, and t3, respectively. More particularly, in the output phase of the set of row signals KROW(0), KROW(1), and KROW(2), the IC 110 controls the row signals KROW(0), KROW(1), and KROW(2) to be pulled to the high voltage level $V_H$ in the time periods t1, t2, and t3, respectively. In addition, the IC 110 is arranged to detect (or read) the column signals KCOL(0), KCOL(1), and KCOL(2) in the input phase of the set of column signals KCOL(0), KCOL(1), and KCOL(2). For example, it is detected (or read) in the IC 110 that the column signal KCOL(0) is asserted by the row signal KROW(0) due to the key press of the user (e.g. the column signal KCOL(0) is pulled to a high voltage level that is close to the high voltage level $V_H$, and more particularly, is greater than a first predetermined voltage level $V_{H\_MIN}$, where the first predetermined voltage level $V_{H\_MIN}$ of this embodiment represents the minimum voltage level to be regarded as a high voltage level), and therefore, the IC 110 determines that a specific key of the set of keys {A1, A10} is pressed.

Afterward, in the output phase of the set of column signals KCOL(0), KCOL(1), and KCOL(2), the IC 110 is arranged to assert the column signals KCOL(0), KCOL(1), and KCOL(2) in the time periods t4, t5, and t6, respectively. More particularly, in the output phase of the set of column signals KCOL(0), KCOL(1), and KCOL(2), the IC 110 controls the column signals KCOL(0), KCOL(1), and KCOL(2) to be pulled to the high voltage level $V_H$ in the time periods t4, t5, and t6, respectively. In addition, the IC 110 is arranged to detect (or read) the row signals KROW(0), KROW(1), and KROW(2) in the input phase of the set of row signals KROW(0), KROW(1), and KROW(2). For example, it is detected (or read) in the IC 110 that the row signal KROW(0) is de-asserted or is not asserted by the column signal KCOL(0) due to the key press of the user (e.g. the row signal KROW(0) is at a low voltage level that is close to the low voltage level $V_L$, and more particularly, is less than a second predetermined voltage level $V_{L\_MAX}$, where the second predetermined voltage level $V_{L\_MAX}$ of this embodiment represents the maximum voltage level to be regarded as a low voltage level), and therefore, the IC 110 determines that the specific key is the key A10, which means the key A10 is pressed.

Please note that, within all of the pulses on the row signals KROW(0), KROW(1), and KROW(2) in the output phase shown in FIG. 3, only the pulse 301 in the time period t1 shown in FIG. 3 is eventually transmitted to be the pulse of the column signal KCOL(0) in the input phase shown in FIG. 4. As the IC 110 detects (or reads) the pulse of the column signal KCOL(0) in the input phase shown in FIG. 4, the IC 110 determines that the specific key of the set of keys {A1, A10} (rather than any set of the other sets of keys {{{A4, A13}, {A7, A16}}, {{A2, A11}, {A5, A14}, {A8, A17}}, {{A3, A12}, {A6, A15}, {A9, A18}}}) is pressed. In addition, in the time period t4 shown in FIG. 5, the IC 110 detects (or reads) the row signal KROW(0) to determine whether the row signal KROW(0) is asserted (more particularly, to determine whether there is a pulse of the row signal KROW(0) in the time period t4). As the IC 110 detects (or reads) the de-asserted partial curve 504 of the row signal KROW(0), the IC 110 determines that the specific key is the key A10, which means the key A10 is pressed.

Figure 6:
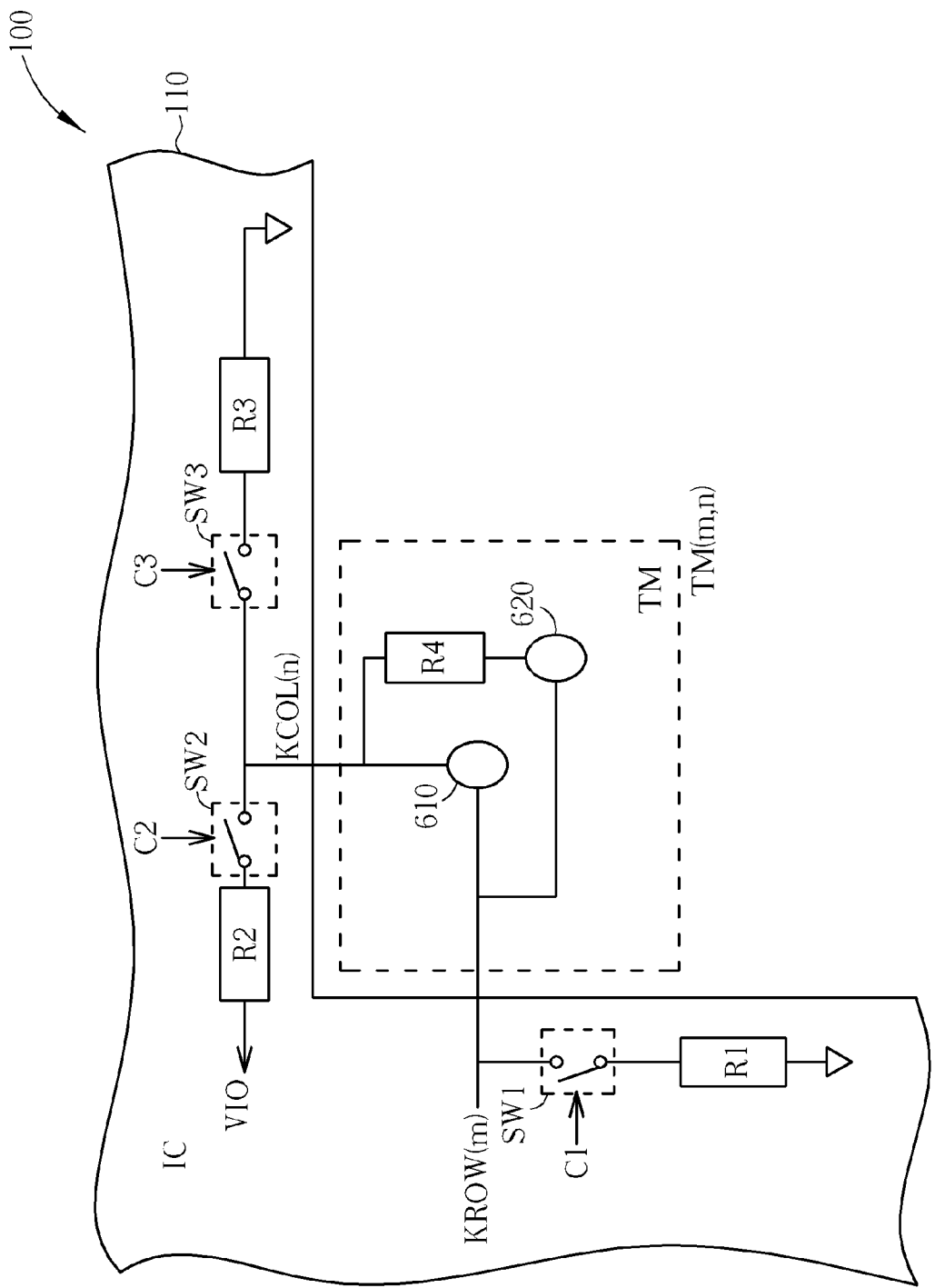
FIG. 6 illustrates some implementation details involved with the apparatus shown in FIG. 1 according to an embodiment of the present invention.

FIG. 6 illustrates some implementation details involved with the apparatus 100 shown in FIG. 1 according to an embodiment of the present invention. The two-key control module TM(m, n) can be taken as an example of the two-key control module under consideration in this embodiment. In addition, the numerals 610 and 620 are utilized for representing the set of keys controlled by the two-key control module TM(m, n). For example, in a situation where (m, n)=(0, 0), the two keys 610 and 620 may represent the keys A1 and A10 of the embodiment shown in FIG. 2, respectively.

As shown in FIG. 6, the apparatus 100 may comprises at least one resistor such as a plurality of resistors R1, R2, R3, and R4, and may further comprise at least one switching unit such as a plurality of switching units SW1, SW2, and SW3 respectively controlled by some control signals C1, C2, and C3 of the IC 110, where the aforementioned decision circuit of the IC 110 of this embodiment comprises the resistors R1, R2, and R3 and the switching units SW1, SW2, and SW3. In this embodiment, a first terminal of the resistor R1 (more particularly, the lower terminal thereof in this embodiment) is electrically connected to a ground voltage level, a first terminal of the resistor R2 (more particularly, the left terminal thereof in this embodiment) is utilized as an input/output terminal VIO within the IC 110, and a first terminal of the resistor R3 (more particularly, the right terminal thereof in this embodiment) is electrically connected to the ground voltage level. In addition, the row pin corresponding to the row signal KROW(m) is electrically connected to a first terminal of the key 610 (more particularly, the left terminal thereof in this embodiment), and is electrically connected to a first terminal of the key 620 (more particularly, the left terminal thereof in this embodiment). Additionally, the column pin corresponding to the column signal KCOL(n) is electrically connected to a second terminal of the key 610 (more particularly, the upper terminal thereof in this embodiment), where a first terminal of the resistor R4 (more particularly, the upper terminal thereof in this embodiment) is electrically connected to the column pin corresponding to the column signal KCOL(n), and a second terminal of the resistor R4 (more particularly, the lower terminal thereof in this embodiment) is electrically connected to a second terminal of the key 620 (more particularly, the upper terminal thereof in this embodiment).

According to this embodiment, the aforementioned decision circuit of the IC 110 is arranged to decide whether the key press is a key press of the key 610 or the key 620 according to a first input/output signal under consideration within the first input/output signals (e.g. the row signal KROW(m)) and according to a second input/output signal under consideration within the second input/output signals (e.g. the column signal KCOL(n)). In addition, during the detection of the key press, the IC 110 temporarily asserts the first input/output signal under consideration (e.g. the row signal KROW(m)) and detects whether the second input/output signal under consideration (e.g. the column signal KCOL(n)) is greater than the first predetermined voltage level $V_{H\_MIN}$ in the aforementioned first time period (e.g. the time period t1 in a situation where (m, n)=(0, 0) and (M, N)=(2, 2)), in order to determine whether one of the key 610 and the key 620 is pressed. More particularly, when it is detected that the second input/output signal under consideration (e.g. the column signal KCOL(n)) is greater than the first predetermined voltage level $V_{H\_MIN}$ in the first time period (e.g. the time period t1 in a situation where (m, n)=(0, 0) and (M, N)=(2, 2)), the decision circuit of the IC 110 determines that one of the key 610 and the key 620 is pressed. Additionally, when it is detected that one of the key 610 and the key 620 is pressed, the IC 110 temporarily asserts the second input/output signal under consideration (e.g. the column signal KCOL(n)) and detects whether the first input/output signal under consideration (e.g. the row signal KROW(m)) is less than the second predetermined voltage level $V_{L\_MAX}$ in the aforementioned second time period (e.g. the time period t4 in a situation where (m, n)=(0, 0) and (M, N)=(2, 2)), in order to determine whether the key 620 or the key 610 is pressed. More particularly, when it is detected that the first input/output signal under consideration (e.g. the row signal KROW(m)) is less than the second predetermined voltage level $V_{L\_MAX}$ in the second time period mentioned above (e.g. the time period t4 in a situation where (m, n)=(0, 0) and (M, N)=(2, 2)), the decision circuit of the IC 110 determines that the key 620 is pressed.

In practice, the IC 110 can utilize the control signals C1, C2, and C3 to temporarily set the architecture shown in FIG. 6 to be in one of a plurality of configurations thereof. For example, in one or more of the configurations, under control of the control signal C1, the switching unit SW1 is arranged to electrically connect a second terminal of the resistor R1 (more particularly, the upper terminal thereof in this embodiment) to the row pin corresponding to the row signal KROW(m), or to electrically disconnect the second terminal of the resistor R1 from the row pin corresponding to the row signal KROW(m). In another example, in one or more of the configurations, under control of the control signal C2, the switching unit SW2 is arranged to electrically connect a second terminal of the resistor R2 (more particularly, the right terminal thereof in this embodiment) to the column pin corresponding to the column signal KCOL(n), or to electrically disconnect the second terminal of the resistor R2 from the column pin corresponding to the column signal KCOL(n). In another example, in one or more of the configurations, under control of the control signal C3, the switching unit SW3 is arranged to electrically connect a second terminal of the resistor R3 (more particularly, the left terminal thereof in this embodiment) to the column pin corresponding to the column signal KCOL(n), or to electrically disconnect the second terminal of the resistor R3 from the column pin corresponding to the column signal KCOL(n).

As mentioned, the two-key control module TM(m, n) can be taken as an example of the two-key control module under consideration in this embodiment. This is for illustrative purposes only, and is not meant to be a limitation of the present invention. As m=0, 1, . . . , or (M−1), and as n=0, 1, . . . , or (N−1), the architecture shown in FIG. 6 can be applied to any two-key control module of the two-key control modules {TM(m, n)|m=0, 1, . . . , or (M−1); n=0, 1, . . . , or (N−1)} disclosed above. In addition, according to this embodiment, the resistors R1, R2, and R3 are implemented within the IC 110, while the resistor R4 is implemented within/on the PCB 120. This is for illustrative purposes only, and is not meant to be a limitation of the present invention. According to some variations of this embodiment, one or more of the resistors R1, R2, and R3 can be implemented within/on the PCB 120.

Figure 7:
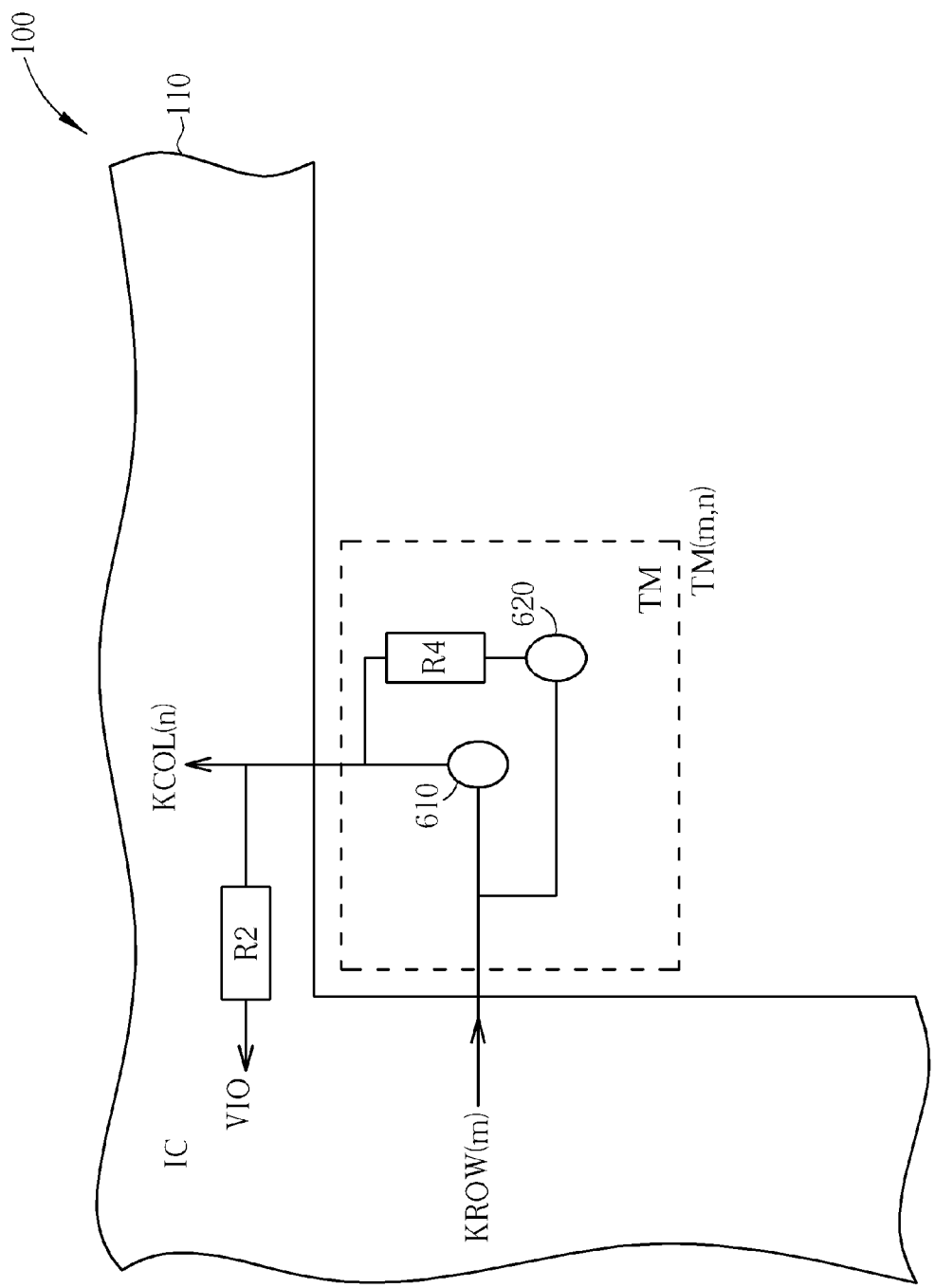
FIG. 7 illustrates a first configuration of the architecture shown in FIG. 6 according to an embodiment of the present invention.

FIG. 7 illustrates a first configuration of the architecture shown in FIG. 6 according to an embodiment of the present invention, where the switching units SW1, SW2, and SW3 and the electrically disconnected portion(s) of the aforementioned decision circuit of the IC 110 are not illustrated in FIG. 7, for brevity. In the first configuration, the row pin corresponding to the row signal KROW(m) is in the output mode thereof, and the column pin corresponding to the column signal KCOL(n) is in the input mode thereof.

According to this embodiment, in a situation where no key is pressed, the IC 110 typically sets the architecture shown in FIG. 6 to be in the first configuration. For example, the IC 110 initially controls the row signal KROW(m) to be at the low voltage level $V_L$, where the resistor R2 is enabled (e.g. the switching unit SW2 is arranged to electrically connect the second terminal of the resistor R2 to the column pin corresponding to the column signal KCOL(n)), causing the column signal KCOL(n) to be pulled high by the voltage level applied to the input/output terminal VIO. When the key 620 is pressed, the IC 110 detects a falling edge of the column signal KCOL(n) (e.g. the voltage drop mentioned above) and starts a key scanning operation, where the key scanning operation can be triggered by the falling edge of the column signal KCOL(n) (e.g. the voltage drop mentioned above) when the architecture shown in FIG. 6 is in the first configuration. Please note that the aforementioned falling edge of the column signal KCOL(n) can be regarded as an interrupt such as that mentioned above.

Figure 8:
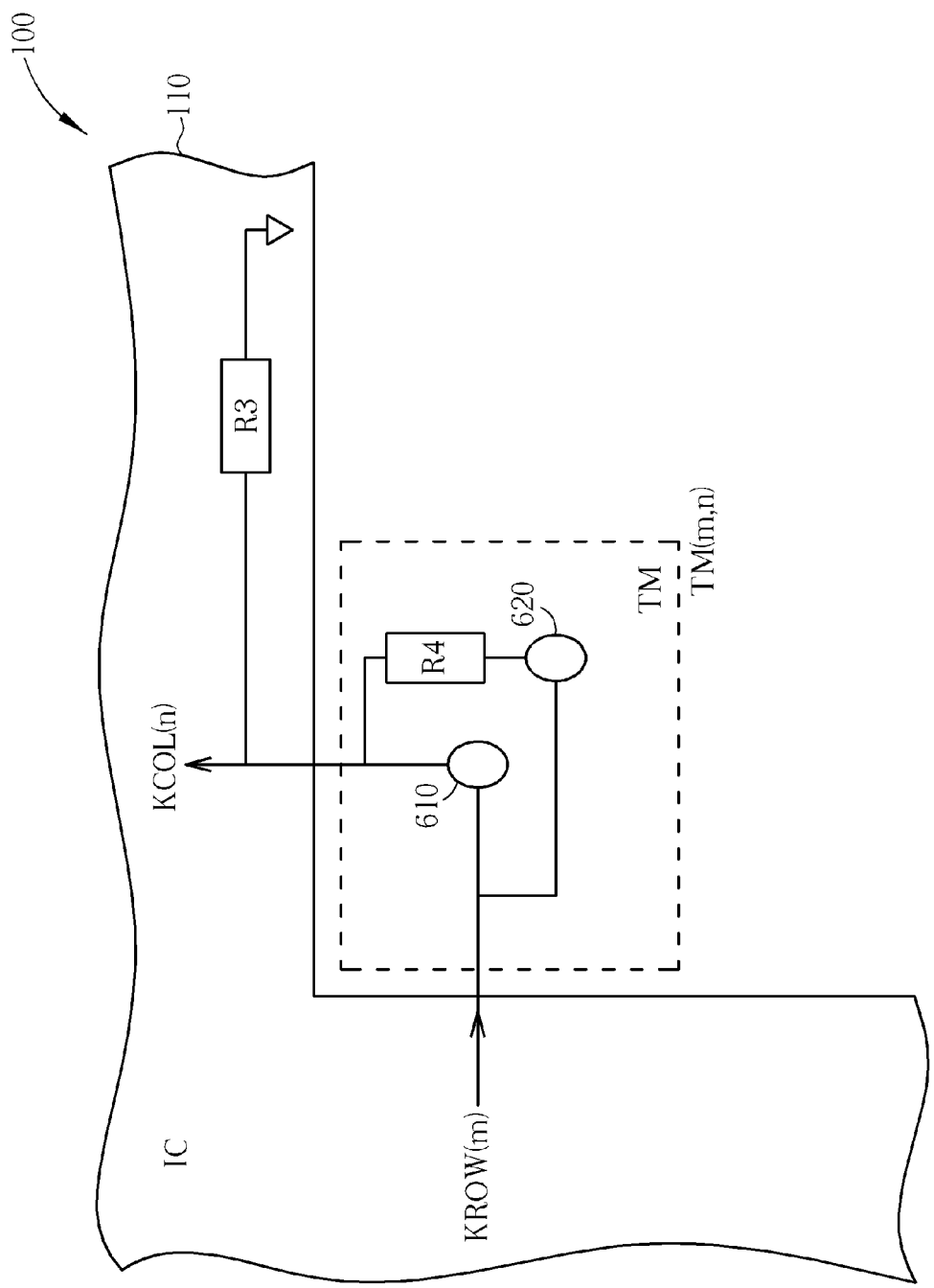
FIG. 8 illustrates a second configuration of the architecture shown in FIG. 6 according to the embodiment shown in FIG. 7.

FIG. 8 illustrates a second configuration of the architecture shown in FIG. 6 according to the embodiment shown in FIG. 7, where the switching units SW1, SW2, and SW3 and the electrically disconnected portion(s) of the aforementioned decision circuit of the IC 110 are not illustrated in FIG. 7, for brevity. In the second configuration, the row pin corresponding to the row signal KROW(m) is in the output mode thereof, and the column pin corresponding to the column signal KCOL(n) is in the input mode thereof.

According to this embodiment, in the beginning of the key scanning operation mentioned above, the IC 110 typically sets the architecture shown in FIG. 6 to be in the second configuration. Suppose that the key 620 is still pressed. For example, the IC 110 initially disables the resistor R2 by utilizing the switching unit SW2, and further enables the resistor R3 by utilizing the switching unit SW3. In addition, during the detection of the key press, the IC 110 temporarily asserts the row signal KROW(m) in the aforementioned first time period (e.g. the time period t1 in a situation where (m, n)=(0, 0) and (M, N)=(2, 2)), where the IC 110 detects whether the column signal KCOL(n) is greater than the first predetermined voltage level $V_{H\_MIN}$ in the first time period (e.g. the time period t1 in a situation where (m, n)=(0, 0) and (M, N)=(2, 2)). More particularly, when it is detected that the column signal KCOL(n) is greater than the first predetermined voltage level $V_{H\_MIN}$ in the first time period mentioned above, the decision circuit of the IC 110 determines that one of the key 610 and the key 620 is pressed.

In practice, when asserting the row signal KROW(m), the IC 110 can temporarily pull the row signal KROW(m) to the high voltage level $V_H$. Based upon the architecture shown in FIG. 8, in a situation where the row signal KROW(m) is at the high voltage level $V_H$, the column signal KCOL(n) is at the voltage level ($V_H*(R3/(R3+R4))$). Thus, the IC 110 compares the voltage level ($V_H*(R3/(R3+R4))$) with the first predetermined voltage level $V_{H\_MIN}$ to determine whether the column signal KCOL(n) is greater than the first predetermined voltage level $V_{H\_MIN}$. As a result, the IC 110 detects that the column signal KCOL(n) is greater than the first predetermined voltage level $V_{H\_MIN}$. In this embodiment, after it is detected that the column signal KCOL(n) is greater than the first predetermined voltage level $V_{H\_MIN}$ in the aforementioned first time period (or after the decision circuit of the IC 110 determines that one of the key 610 and the key 620 is pressed), the IC 110 can control the architecture shown in FIG. 8 to switch to another configuration such as that shown in FIG. 9, for further detection.

Figure 9:
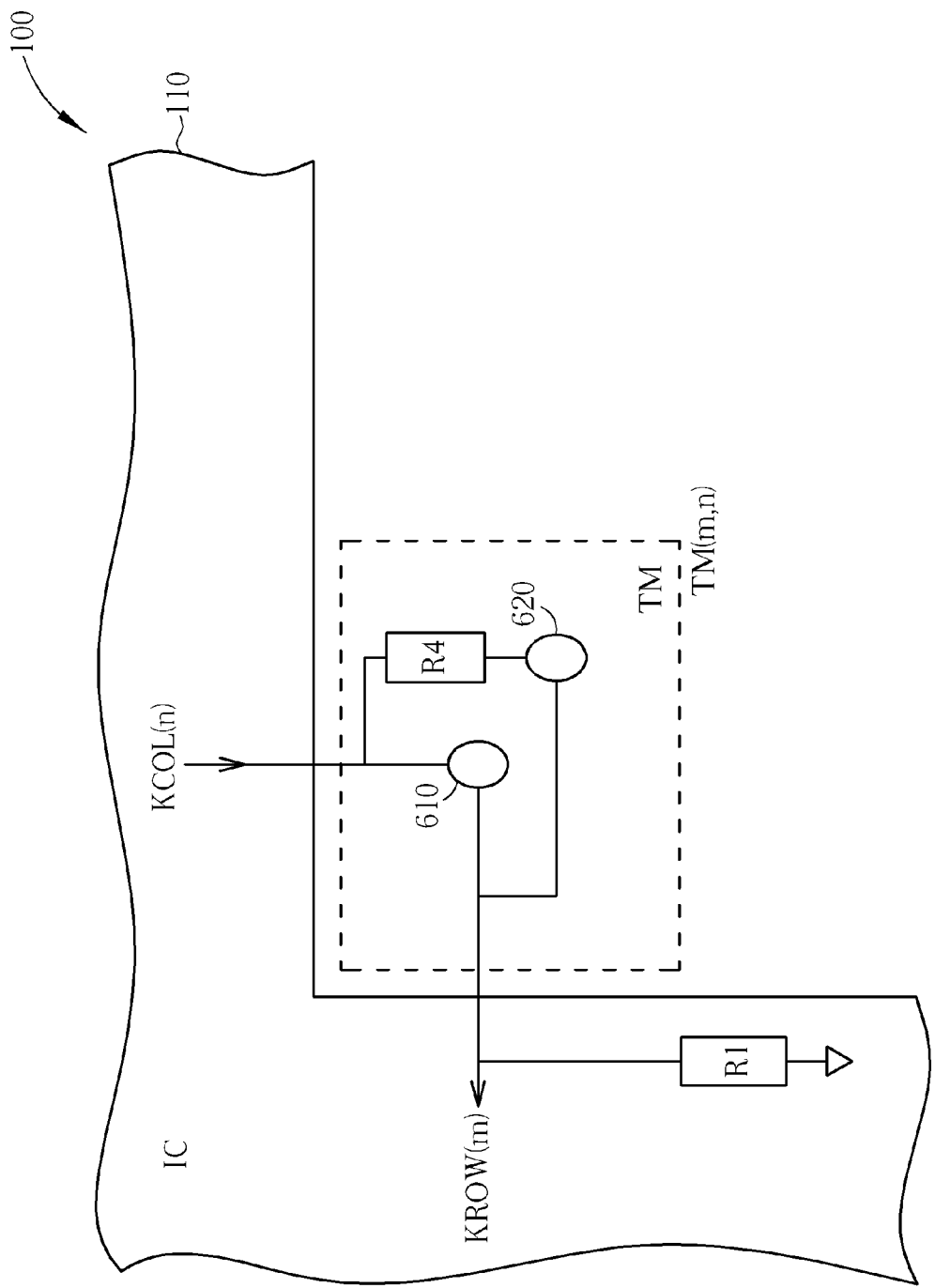
FIG. 9 illustrates a third configuration of the architecture shown in FIG. 6 according to the embodiment shown in FIG. 7.

FIG. 9 illustrates a third configuration of the architecture shown in FIG. 6 according to the embodiment shown in FIG. 7, where the switching units SW1, SW2, and SW3 and the electrically disconnected portion(s) of the aforementioned decision circuit of the IC 110 are not illustrated in FIG. 7, for brevity. In the third configuration, the row pin corresponding to the row signal KROW(m) is in the input mode thereof, and the column pin corresponding to the column signal KCOL(n) is in the output mode thereof.

According to this embodiment, in the key scanning operation mentioned above, after the detection performed in the second configuration is completed, the IC 110 typically sets the architecture shown in FIG. 6 to be in the third configuration. Suppose that the key 620 is still pressed. For example, the IC 110 initially disables the resistor R3 by utilizing the switching unit SW3, and further enables the resistor R1 by utilizing the switching unit SW1. In addition, during the detection of the key press, the IC 110 temporarily asserts the column signal KCOL(n) in the aforementioned second time period (e.g. the time period t4 in a situation where (m, n)=(0, 0) and (M, N)=(2, 2)), where the IC 110 detects whether the row signal KROW(m) is less than the second predetermined voltage level $V_{L\_MAX}$ in the second time period (e.g. the time period t4 in a situation where (m, n)=(0, 0) and (M, N)=(2, 2)). More particularly, when it is detected that the row signal KROW(m) is less than the second predetermined voltage level $V_{L\_MAX}$ in the second time period mentioned above, the decision circuit of the IC 110 determines that the key 620 is pressed.

In practice, when asserting the column signal KCOL(n), the IC 110 can temporarily pull the column signal KCOL(n) to the high voltage level $V_H$. Based upon the architecture shown in FIG. 9, in a situation where the column signal KCOL(n) is at the high voltage level $V_H$, the row signal KROW(m) is at the voltage level ($V_H*(R1/(R1+R4))$). Thus, the IC 110 compares the voltage level ($V_H*(R1/(R1+R4))$) with the second predetermined voltage level $V_{L\_MAX}$ to determine whether the row signal KROW(m) is less than the second predetermined voltage level $V_{L\_MAX}$. As a result, the IC 110 detects that the row signal KROW(m) is less than the second predetermined voltage level $V_{L\_MAX}$. In this embodiment, after it is detected that the row signal KROW(m) is less than the second predetermined voltage level $V_{L\_MAX}$ in the aforementioned second time period (or after the decision circuit of the IC 110 determines that the key 620 is pressed), the IC 110 can control the architecture shown in FIG. 9 to switch to another configuration such as that shown in FIG. 8, for further detection of a key press, which can be a key press of the same key or a key press of another key. In a situation where no key press is detected, the IC 110 can control the architecture shown in FIG. 9 to switch to another configuration such as that shown in FIG. 7.

It is an advantage of the present invention that, any of the embodiments/variations disclosed above provides a feasible method to reduce the number of necessary pins for a key matrix. The key layout (more particularly, the arrangement of the keys) can be kept unchanged to prevent additional costs from being introduced, where no routing complexity is induced. In addition, there is no need to take special consideration on multi-key assignment. In contrast to the related art, the key matrix pin count corresponding to forty-nine keys implemented according to any of the embodiments/variations disclosed above can be ten (e.g. (5+5) pins for (7*7) keys), which is helpful on reducing the overall pin count.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing key control, the apparatus comprising at least one portion of an electronic device, the apparatus comprising:

an integrated circuit (IC) arranged to detect a key press according to at least one portion of a plurality of input/output signals of a key matrix comprising a plurality of keys, wherein the input/output signals of the key matrix comprise a plurality of first input/output signals corresponding to a first direction, and further comprise a plurality of second input/output signals corresponding to a second direction, and the IC comprises:
- a plurality of first pins arranged to transmit the plurality of first input/output signals corresponding to the first direction; and
- a plurality of second pins arranged to transmit the plurality of second input/output signals corresponding to the second direction;

wherein during the detection of the key press, under control of the IC,
- at least one first pin of the plurality of first pins is in an output mode and each second pin of the plurality of second pins is in an input mode in a first time period, and
- at least one second pin of the plurality of second pins is in an output mode and each first pin of the plurality of first pins is in an input mode in a second time period.

2. The apparatus of claim 1, wherein the first direction and the second direction correspond to rows and columns of the key matrix, respectively.

3. The apparatus of claim 2, wherein the first pins are row pins, and the second pins are column pins; the first input/output signals are row signals, and the second input/output signals are column signals.

4. The apparatus of claim 1, wherein in the first time period, the IC temporarily asserts a first input/output signal that is transmitted by utilizing the at least one first pin; and in the second time period, the IC temporarily asserts a second input/output signal that is transmitted by utilizing the at least one second pin.

5. The apparatus of claim 4, wherein in the first time period, the IC temporarily asserts the first input/output signal by pulling the first input/output signal to a high voltage level of the first input/output signal; and in the second time period, the IC temporarily asserts the second input/output signal by pulling the second input/output signal to a high voltage level of the second input/output signal.

6. The apparatus of claim 5, wherein the high voltage level of the first input/output signal is equivalent to the high voltage level of the second input/output signal.

7. The apparatus of claim 4, wherein in the first time period, the IC temporarily de-asserts the second input/output signals that are transmitted by utilizing the second pins; and in the second time period, the IC temporarily de-asserts the first input/output signals that are transmitted by utilizing the first pins.

8. The apparatus of claim 7, wherein in the first time period, the IC temporarily de-asserts the second input/output signals by keeping the second input/output signals at a low voltage level thereof; and in the second time period, the IC temporarily de-asserts the first input/output signals by keeping the first input/output signals at a low voltage level thereof.

9. The apparatus of claim 8, wherein the low voltage level of the second input/output signals is equivalent to the low voltage level of the first input/output signals.

10. The apparatus of claim 1, wherein one of the first pins is in the output mode at a time during the detection of the key press; and one of the second pins is in the output mode at a time during the detection of the key press.

11. The apparatus of claim 1, wherein the first pin is electrically connected to a first terminal of a first key of the key matrix and is electrically connected to a first terminal of a second key of the key matrix; the second pin is electrically connected to a second terminal of the first key; and the apparatus further comprises:
- a resistor having a first terminal and a second terminal, wherein the first terminal of the resistor is electrically connected to the second pin, and the second terminal of the resistor is electrically connected to a second terminal of the second key.

12. An apparatus for performing key control, the apparatus comprising at least one portion of an electronic device, the apparatus comprising:
- an integrated circuit (IC) arranged to detect a key press according to at least one portion of a plurality of input/output signals of a key matrix comprising a plurality of keys, wherein the input/output signals of the key matrix comprise a plurality of first input/output signals corresponding to a first direction, and further comprise a plurality of second input/output signals corresponding to a second direction, and the IC comprises:
  - a decision circuit arranged to decide whether the key press is a key press of a first key or a second key within the plurality of keys according to a first input/output signal of the first input/output signals and according to a second input/output signal of the second input/output signals;

wherein during the detection of the key press, the IC temporarily asserts the first input/output signal and detects whether the second input/output signal is greater than a first predetermined voltage level in a first time period, in order to determine whether one of the first key and the second key is pressed; and
when it is detected that one of the first key and the second key is pressed, the IC temporarily asserts the second input/output signal and detects whether the first input/output signal is less than a second predetermined voltage level in a second time period, in order to determine whether the second key/the first key is pressed.

13. The apparatus of claim 12, wherein in the first time period, the IC temporarily asserts the first input/output signal by pulling the first input/output signal to a high voltage level of the first input/output signal; and in the second time period, the IC temporarily asserts the second input/output signal by pulling the second input/output signal to a high voltage level of the second input/output signal.

14. The apparatus of claim 13, wherein the high voltage level of the first input/output signal is equivalent to the high voltage level of the second input/output signal.

15. The apparatus of claim 12, wherein in the first time period, the IC temporarily de-asserts the second input/output signals; and in the second time period, the IC temporarily de-asserts the first input/output signals.

16. The apparatus of claim 15, wherein in the first time period, the IC temporarily de-asserts the second input/output signals by keeping the second input/output signals at a low voltage level thereof; and in the second time period, the IC temporarily de-asserts the first input/output signals by keeping the first input/output signals at a low voltage level thereof.

17. The apparatus of claim 16, wherein the low voltage level of the second input/output signals is equivalent to the low voltage level of the first input/output signals.

18. The apparatus of claim 12, wherein the IC comprises a first pin arranged to transmit the first input/output signal, and further comprises a second pin arranged to transmit the second input/output signal; and the decision circuit comprises:
- at least one resistor, a first terminal of which is electrically connected to a ground voltage level; and
- at least one switching unit arranged to electrically connect a second terminal of the at least one resistor to one of the first pin and the second pin/electrically disconnect the second terminal of the at least one resistor from the one of the first pin and the second pin.

19. The apparatus of claim 18, wherein the at least one resistor comprises a first resistor whose first terminal is electrically connected to the ground voltage level, and further comprises a second resistor whose first terminal is electrically connected to the ground voltage level; the at least one switching unit comprises a first switching unit arranged to electrically connect the second terminal of the first resistor to the first pin/electrically disconnect the second terminal of the first resistor from the first pin, and further comprises a second switching unit arranged to electrically connect the second terminal of the second resistor to the second pin/electrically disconnect the second terminal of the second resistor from the second pin.

20. The apparatus of claim 18, wherein the decision circuit further comprises:
 a third resistor, a first terminal of which is utilized as an input/output terminal within the IC; and
 a third switching unit arranged to electrically connect a second terminal of the third resistor to the second pin/electrically disconnect the second terminal of the third resistor from the second pin.

21. An apparatus for performing key control, the apparatus comprising at least one portion of an electronic device, the apparatus comprising:
 an integrated circuit (IC) arranged to detect a key press according to at least one portion of a plurality of input/output signals of a key matrix comprising a plurality of keys, wherein the input/output signals of the key matrix comprise a plurality of first input/output signals corresponding to a first direction, and further comprise a plurality of second input/output signals corresponding to a second direction, and the IC comprises:
  a plurality of first pins arranged to transmit the plurality of first input/output signals corresponding to the first direction, wherein a first pin of the first pins is electrically connected to a first terminal of a first key of the key matrix and is electrically connected to a first terminal of a second key of the key matrix; and
  a plurality of second pins arranged to transmit the plurality of second input/output signals corresponding to the second direction, wherein a second pin of the second pins is electrically connected to a second terminal of the first key; and
 a resistor having a first terminal and a second terminal, wherein the first terminal of the resistor is electrically connected to the second pin, and the second terminal of the resistor is electrically connected to a second terminal of the second key.

\* \* \* \* \*